United States Patent [19]

Reele

[11] Patent Number: 5,777,352

[45] Date of Patent: Jul. 7, 1998

[54] PHOTODETECTOR STRUCTURE

[75] Inventor: Samuel Reele, Rochester, N.Y.

[73] Assignee: Eastman Kodak Company, Rochester, N.Y.

[21] Appl. No.: 975,878

[22] Filed: Nov. 21, 1997

Related U.S. Application Data

[63] Continuation of Ser. No. 715,982, Sep. 19, 1996, abandoned.

[51] Int. Cl.$^6$ ................................................ H01L 31/0328
[52] U.S. Cl. .......................... 257/184; 257/431; 257/448; 257/461; 257/462
[58] Field of Search .................................. 257/184, 431, 257/438, 443, 448, 452, 457, 458, 461, 463

[56] References Cited

U.S. PATENT DOCUMENTS

| | | | |
|---|---|---|---|
| 4,794,443 | 12/1988 | Tanaka et al. | 357/43 |
| 4,811,071 | 3/1989 | Roloff | 357/34 |
| 4,815,060 | 3/1989 | Nomura | 369/46 |
| 4,866,401 | 9/1989 | Terasima | 330/310 |
| 4,887,141 | 12/1989 | Bertotti et al. | 357/36 |
| 4,890,149 | 12/1989 | Bertotti et al. | 357/48 |
| 4,891,682 | 1/1990 | Yusa et al. | 357/30 |
| 4,982,245 | 1/1991 | Hanaoka et al. | 357/15 |
| 5,001,334 | 3/1991 | Ikeda | 250/201.5 |
| 5,021,860 | 6/1991 | Bertotti et al. | 357/48 |
| 5,065,387 | 11/1991 | Roth et al. | 369/44.41 |
| 5,408,122 | 4/1995 | Reele | 257/446 |
| 5,412,243 | 5/1995 | Morishita | 257/462 |

OTHER PUBLICATIONS

Sze Physics of Semiconductor Devices p. 783, 1981.

*Primary Examiner*—Sara W. Crane
*Assistant Examiner*—Douglas A. Wille
*Attorney, Agent, or Firm*—Edward Dugas

[57] ABSTRACT

A photodetector that incorporates at least two photosensitive regions (separated by at least one physical gap) of a first semiconductor type with the at least two photosensitive regions being supported on a substrate and acting as first terminals of the photodetector is improved by; adding a second semiconductor type into the physical gap(s) abutting the at least two photosensitive regions. The second semiconductor region(s) form a barrier to the out diffusion between the at least two photosensitive regions of the first semiconductor type. Additionally, the second semiconductor type region acts as a second photodetector terminal. This improved geometry results in faster rise and fall times of the photodetector's output current by decreasing the 3-D spaces within the gap(s) between the at least two photosensitive regions which were not subjected to the presence of an E-field when unimproved photodetectors were biased into operation.

18 Claims, 5 Drawing Sheets

PHOTODETECTOR STRUCTURE

This is a continuation of application Ser No. 08/715,982, filed Sep. 19, 1996 now abandoned.

FIELD OF THE INVENTION

The invention relates generally to the field of photodetectors and in particular to a photodetector geometry that reduces the rise and fall times of photoconductive output currents.

BACKGROUND OF THE INVENTION

High speed optical read/write applications require photodetectors that can provide fall times in the order of less than 10 nano seconds. (where fall time is defined as 90% of peak output to 10% of the steady state final output). Additionally, small signal settling times, (defined as 10% of initial value to 1% of steady state value) must be on the order of $25 \leq$ns.

As optical recording systems have evolved from full height drives to ½ height drives, to ⅓ height drives, and in the foreseeable future, to ¼ height drives; optical heads have been required to shrink in size. Along with shrinking head size there has occurred an integration of the optical components used with the head. Altogether this has caused optical spots, reflected from discs, to have significantly decreased in size. With this decrease in spot size, the ratio of the location tolerances of the optical spots on the detectors to the actual spot size has increased. With this decrease in spot size and increased tolerance of location, there is an increase in the difficulty of alignment. This difficulty in alignment is generally addressed by making the detectors "artificially" larger than they need to be, resulting in slower detectors with inherently larger rise, fall, and settling times. When these larger detectors are used in sampled Focus and Tracking optical recording systems they limit system level bandwidths which ultimately limits read/write speeds. This inherent lower bandwidth, for larger detectors, is caused by higher shunt resistance and larger shunt capacitance of the photo conductive areas of the detectors.

Ways in which people normally skilled in the art have handled these situations have been to decrease detector sizes, (living with larger than needed detectors) to accommodate mechanical tolerances and alignment difficulties and/or design systems where some of the light falls off the photodetector which results in lower signals, lower bandwidth, and lower signal-to-noise ratios.

In addition, with a smaller spot size the ratio of light falling into the gap of two segmented semiconductor photodetectors to that actual falling on the detector elements has increased.

To operate with adequate speed for sampled read/write architectures, the semiconductor photodetectors have been highly reverse biased such that they are in a fully depleted photoconductive mode versus a photo-voltaic mode of operation. As will be explained, this in turn results in a fully depleted gap. Referring to Prior Art FIG. 1, the photodetector 100 is shown in cross section having a substrate 120 formed of n++ type material onto which is grown an n type epitaxial layer 140. Two p+ regions 180 and 200 are deposited and diffused into the layer 140 at locations that define the photosensitive elements of the detector. Over the surface of the partially formed photodetector is deposited a layer of silicon dioxide 220. Openings in the p+ regions 180 and 200 are metallized forming ohmic contacts 240 and 260. A thin layer 280 of silicon nitride is formed everywhere on the top surface of the photodetector, except the bonding pad areas.

A thin electrically conductive layer 320 of gold or other conductive material is deposited on the back surface of the n++ layer 120.

Typically in such a prior art detector, the epitaxial layer 140 is on the order of 15 to 25 microns thick and the p+ regions 180 and 200 are 1.5 microns thick. The epitaxial thickness is selected to optimize the peak of the photodetector's response curve for a single wavelength of incident radiation. When the photodetector is electrically biased into operation and light impinges on the detector, minority carriers are generated throughout the entire epitaxial region 140. In the Prior Art FIG. 1, the depletion regions 500A and 500B are shown for photodetector regions 180 and 200, respectively, having a relatively large non-depleted region 501 deep within the epitaxial layer 140 and adjacent to the n++ layer 120. Additionally, through surface effects in the silicon dioxide, there is a smaller non-depleted region 502 in the epitaxial layer 140 near the surface adjacent the silicon dioxide layer 220.

FIGS. 2A, 2B, and 2C (Prior Art), collectively illustrate the field theory associated with the Prior Art semiconductor photodetector structure of Prior Art FIG. 1. A metallurgical junction 62 is created at the juncture of the p+ region 180 and the epitaxial layer 140. Similarly, a metallurgical junction 62 is also created at the p+ region 200 and the epitaxial layer 140. As per standard E-field theory, the total charge developed by the donor impurity ions ($N_D$) in the depleted region 500A$_1$ of region 500A is equal to the charge developed by the acceptor impurity ions ($N_A$) in the depleted region 500A$_2$ of region 500A, wherein the number of mobile carriers is equal to the number of impurity ions for depletion regions 500A$_1$ and 500A$_2$. The same is true for the depletion region 500B. The E-field generated from the charge density profile of FIG. 2B is shown in FIG. 2C. As can be seen, the E-field is maximum at the metallurgical junction 62 and goes to zero at the edge of the depletion regions. At a depth t1 and a distance d, the velocity of the minority carriers generated in the gap are accelerated at an increasing rate by an increasing E-field until they reach the metallurgical junction 62 at which the velocity is greatest. Thereafter, the velocity at which they travel is decreasing due to a decreasing E-field until they reach the edge of the depletion regions 500A$_2$. Although the E-field is non-uniform across the depletion regions it is in existence and goes to zero only at the edge of the depletion region where other forces take effect. In contrast, the velocity of minority carriers generated at a depth t2 and the same distance d into the gap are not accelerated by an E field until they reach the edge of the depletion region 500A since no E field is present in this region. During the transient time to the edge of the depletion region of 500A, the minority carriers are traveling at a velocity defined by minority mobility time constant rates which are much slower than velocities developed under the influence of an E field. Once the minority carriers reach the depletion region 500A$_1$, the minority carrier velocity is increased at an increasing rate by an increasing E-field until they reach the metallurgical junction 62. Thereafter the minority carrier velocities are decreased at a decreasing rate by a decreasing E-field until they reach the edge of the depletion region 500A$_2$, wherein other forces take effect. Since the E-field was zero during a significant portion of the transit time, $tt_1 \sim tt_2$ $\{tt_1/(tt_1 \oplus tt_2 \oplus tt_3)\} > 40\%$, the minority carriers generated at this depth are slower than those generated at a depth t1. Since minority carriers are generated throughout the epitaxial layer 140, it is obviously

3 desirable to generate fully depleted gaps in the 3-D spaces where the E-fields are not zero. This becomes especially true when a photodetector is used in optical systems that are sampled to within 1% accuracy where one must wait to sample 99% of all carriers generated and cannot ignore 10% of the carriers as in past systems.

Ways in which people normally skilled in the art have handled the gap problem has been to decrease the gap. A limit is quickly reached before undesirable or unachievable results occur.

The invention as disclosed solves the above problems by a photodetector design consisting of a more rectangular depletion region which minimizes the gap effect of slower carriers exposed to no E-field. The rectangular depletion region is faster with inefficient 3-D spaces in the depletion region of the photodetector being minimized.

SUMMARY OF THE INVENTION

The present invention is directed to overcoming one or more of the problems set forth above. Briefly summarized, according to one aspect of the present invention there is provided a photodetector, comprising:

at least two photosensitive regions of first semiconductor type supported on a substrate and acting as first terminals of the photodetector; and regions of a second semiconductor type separating and abutting the at least two photosensitive regions for forming a barrier to the at least two photosensitive regions of the first semiconductor type and acting as part of a second terminal through like type substrate.

These and other objects, features, and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the following advantages by minimizing the 3-D spaces in the depletion region of the photodetector that are not exposed to an E-field: an increase in output currents for a given photon input, along with decreased rise and fall times in the output currents is achieved.

BRIEF DESCRIPTION OF THE DRAWINGS

To facilitate understanding, identical reference numerals have been used, where possible, to designate identical elements that are common to the figures.

4

DETAILED DESCRIPTION OF THE INVENTION

Figure 3:
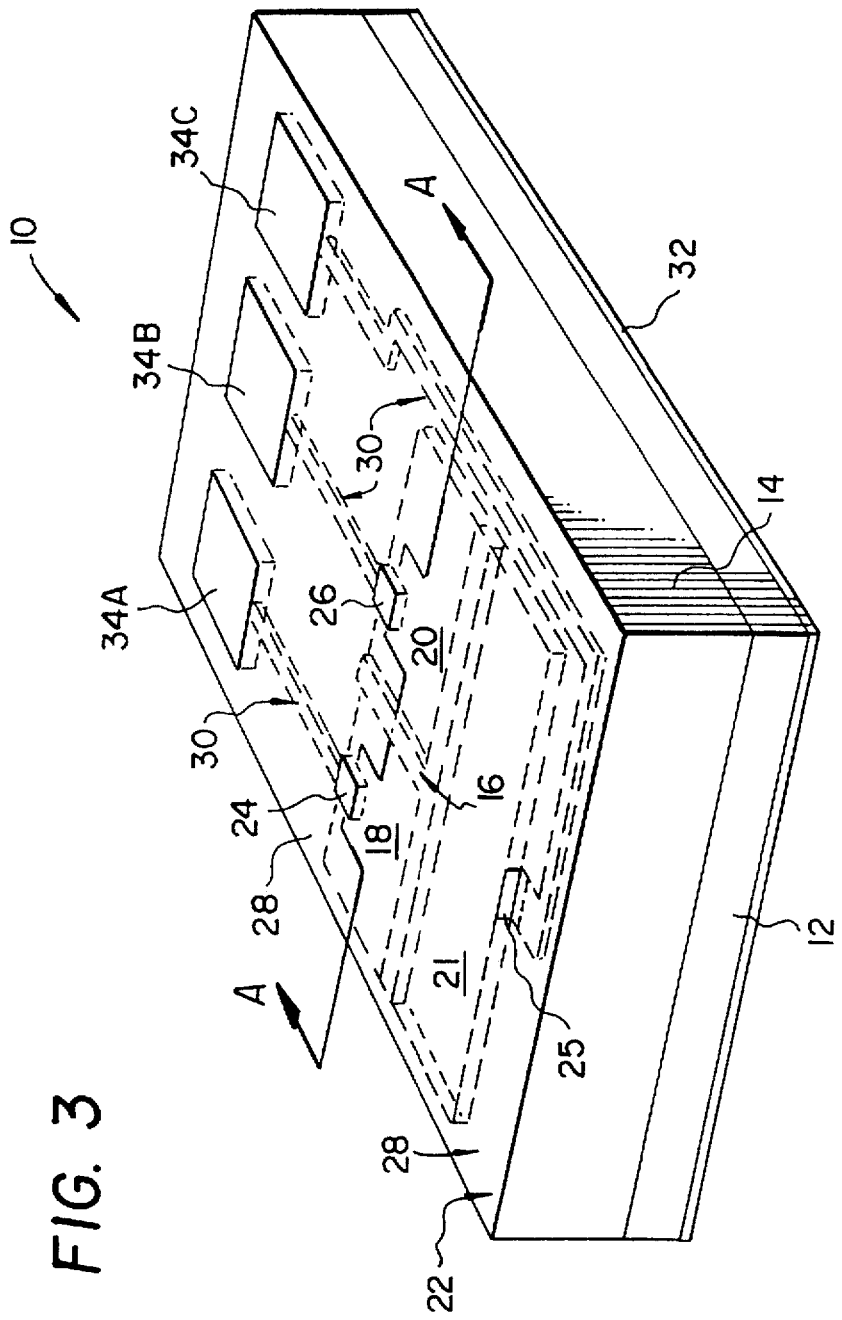
FIG. 3 is a perspective view of the preferred embodiment of the invention.

Referring to FIG. 3, the detector 10 is shown having a substrate 12, of n++ type material, onto which is grown an n type epitaxial layer 14. An n+ region 16 is deposited and partially diffused into layer 14 at the location of the desired gaps between photosensitive areas of the detector. The p+ regions 18, 20 and 21, are deposited and diffused into the layer 14 at locations that define the photosensitive elements abutting the n+ region 16. Over the surface of the partially formed detector is deposited a thin layer of silicon dioxide 22. Openings in the p+ regions 18, 20, and 21 are metallized forming ohmic contacts 24, 25, and 26. Interconnection leads 30 are formed using any well known technique such as sputtering and etching and connect the standard bonding pads 34A, B, and C to the ohmic contacts of the respective detector elements. A layer 28 of silicon nitride is formed everywhere on the top surface except over bonding pads 34A, B, and C. A thin electrically conductive layer 32 of gold or other material is deposited on the back surface of substrate 12.

Figure 4:
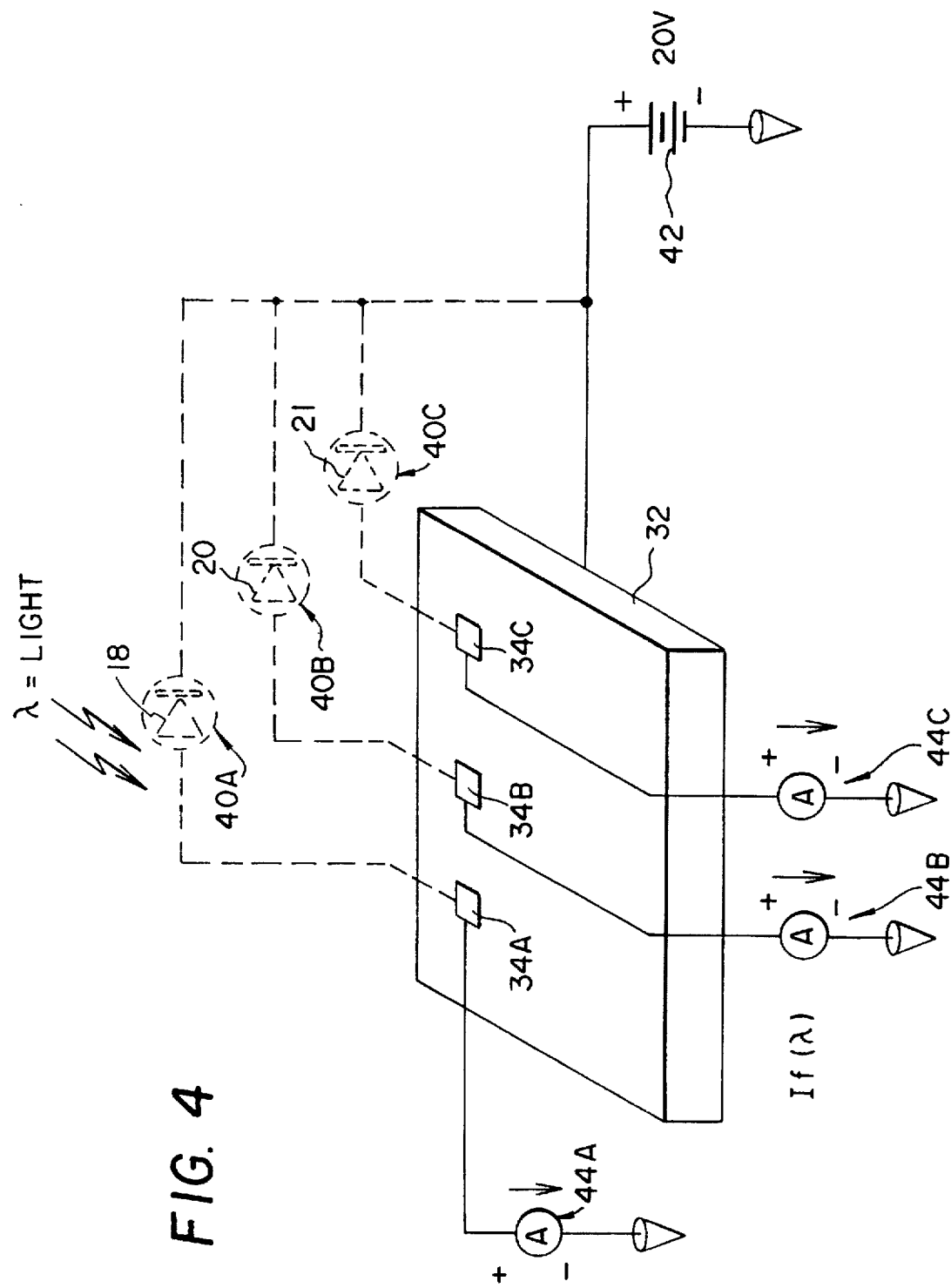
FIG. 4 is a circuit block diagram illustrating operating potentials.

Referring to FIG. 4, the photodetector 10, and the schematic representation of the bias circuitry normally connected to the photodetector are illustrated. A voltage source 42 is connected between ground and layer 32 which acts as the common cathode of the photodiode (detector) elements (p+ regions) 18, 20, and 21. The photodiodes are represented as dotted line equivalent light activated diodes 40A, 40B, and 40C, respectively. As illustrated, amp meters 44A, 44B, and 44C, are connected between a ground and the bonding pads 34A, 34B, and 34C, respectively. The bonding pads are the equivalent anodes of the photodiode (detector) p+ regions 18, 20, and 21, respectively where light impinging on the light sensitive anodes results in light dependent currents that are sourced out of the anodes for subsequent signal processing.

Figure 5:
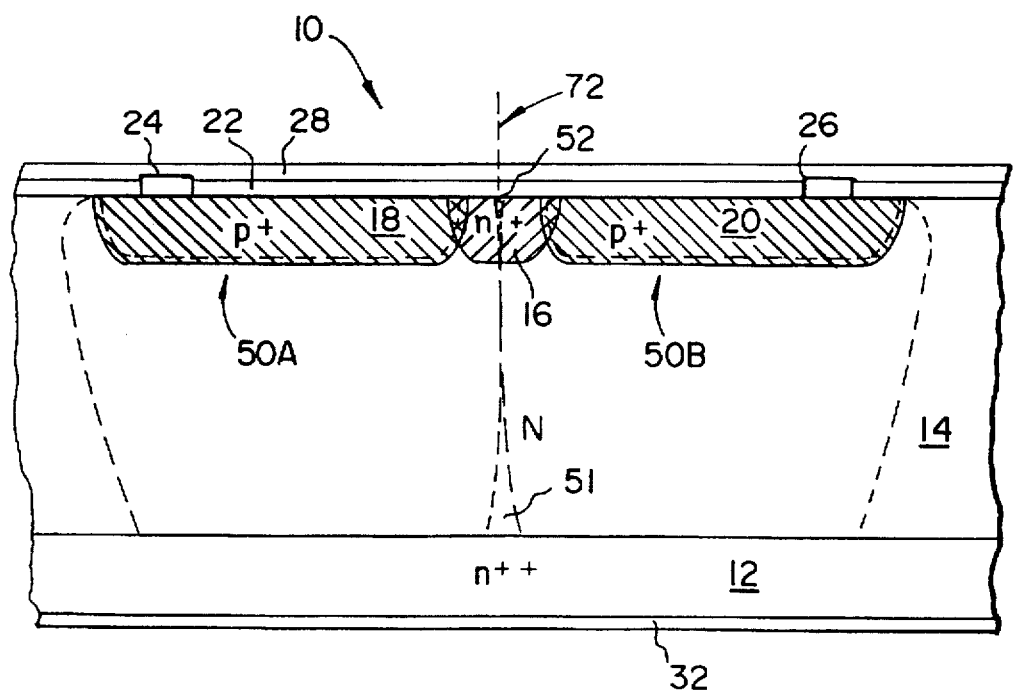
FIG. 5 illustrates a cross section of the preferred embodiment of FIG. 3 taken along the section lines labeled A—A.
Figure 2A:
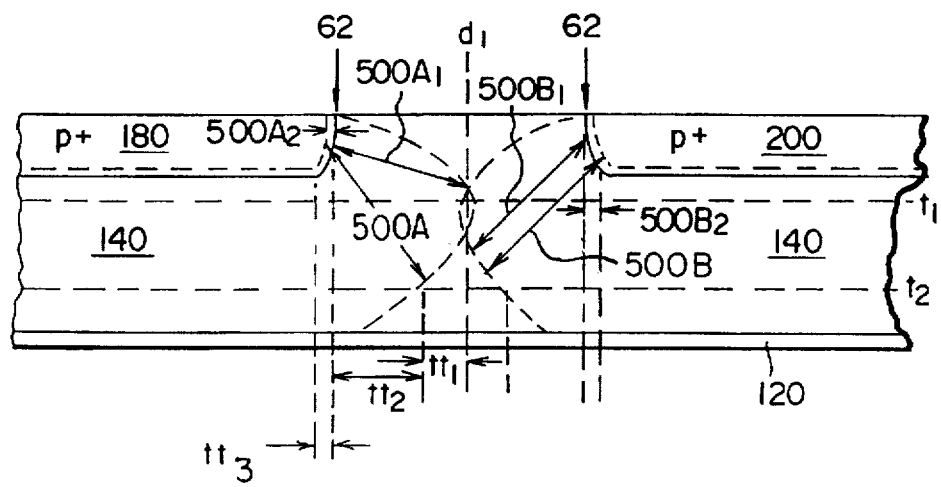
FIGS. 2A, 2B, and 2C, illustrate an exploded gap region, a charge density profile, and an E-field profile, respectively, for a Prior Art photodetector of the type illustrated in FIG. 1.
Figure 2B:
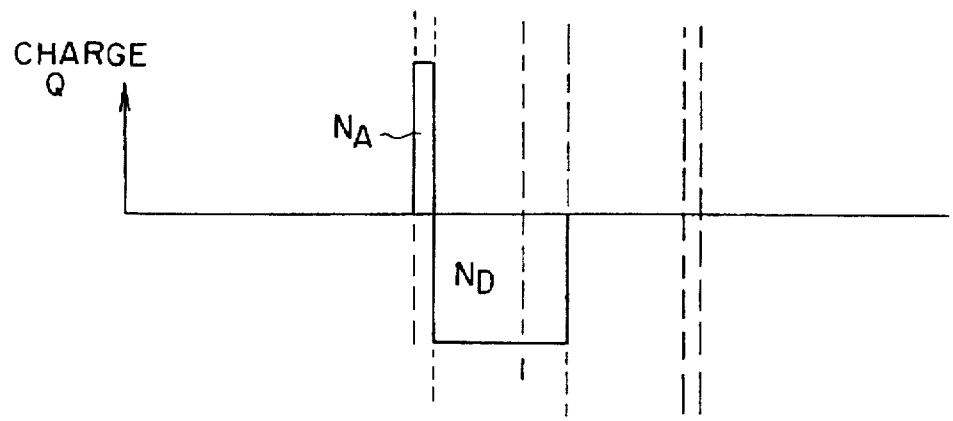
Figure 2C:
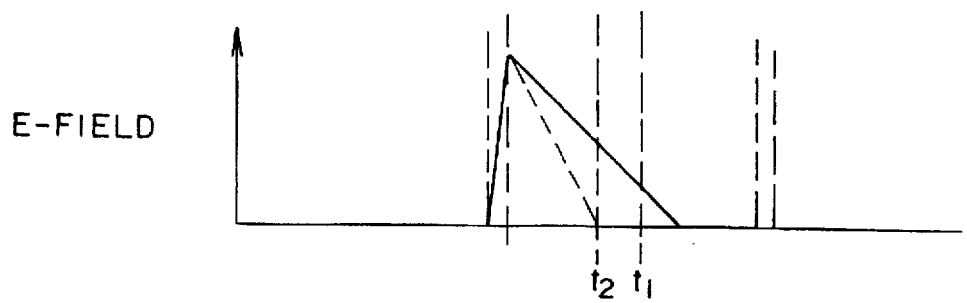

When the photodetector 10 is biased as shown in FIG. 4, depletion regions 50A and 50B are developed as schematically shown in FIG. 5. The predeposited n+ region 16 creates a barrier to wall the p+ regions 18, 20, and 21, (not shown in this view) as they were diffused. This in turn effectively causes a steeper, less tapered profile between the p+ regions 18, 20, and 21, and the n+ region 16 via vertical contact to the n+ region 16. When highly reversed biased, the depletion regions 50A and 50B expand along the centerline of the gap labeled 72, in a manner in which they maximize the surface of abutment to each other.

Figure 1:
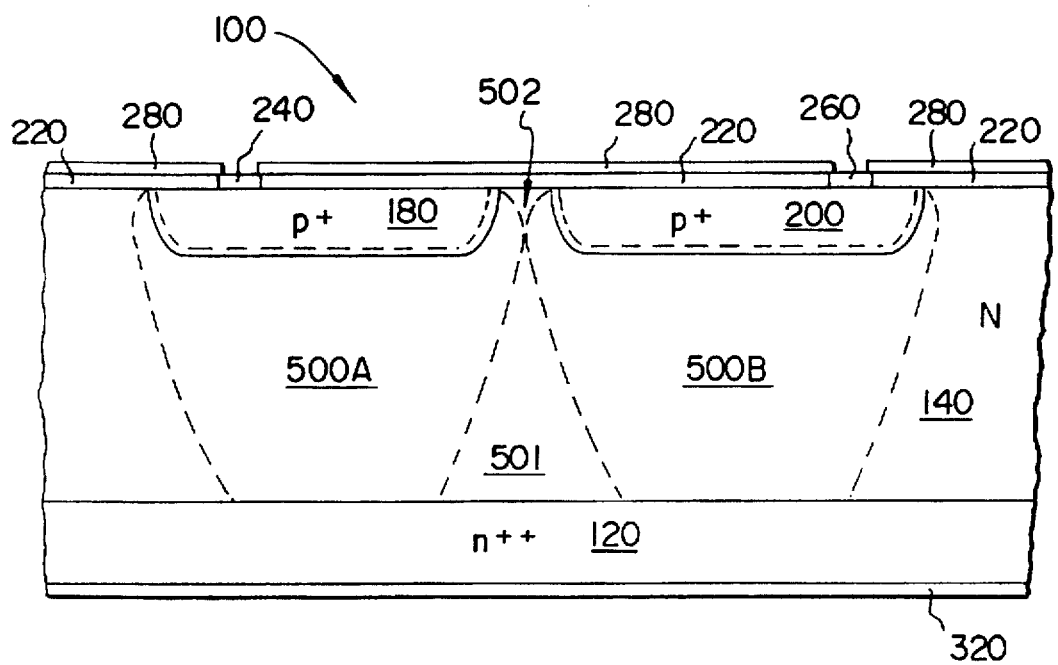
FIG. 1 illustrates in cross section a Prior Art photodetector.

The 3-D spaces 51 and 52, in the preferred embodiment of the invention, are much smaller than the corresponding areas 501 and 502 of the prior art device shown in FIG. 1. As a result, the travel time for the summation of 99% of minority carriers is faster than prior art structures where the 3-D spaces containing no E-fields are much greater. The photodetector 10 has been fabricated from a split lot and test results have shown 1.5 to 2.0 nano-seconds faster fall times to within 1% accuracy over that of prior art photodetector structures fabricated from the same lot.

Figure 6A:
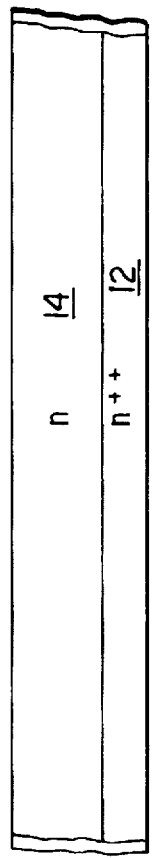
FIGS. 6A to 6E is a flow chart illustrating the preferred process for forming the preferred photodetector of FIG. 3.
Figure 6B:
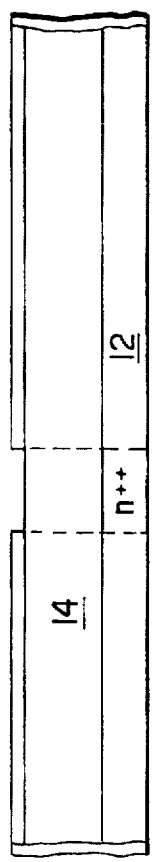
Figure 6C:
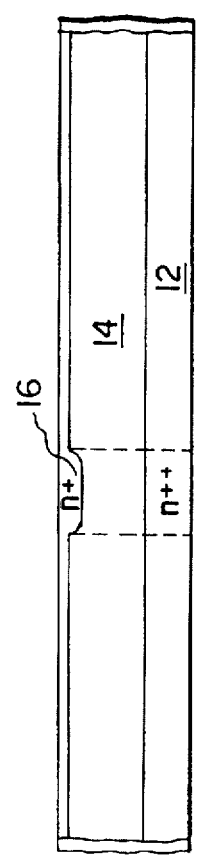
Figure 6D:
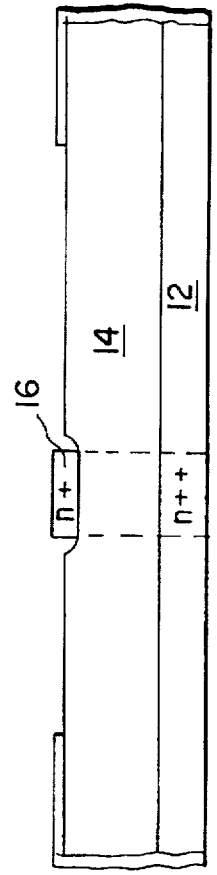
Figure 6E:
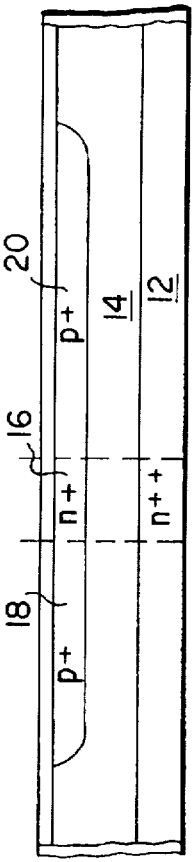

Referring to the flow diagram represented by FIGS. 6A through 6E, the steps for fabricating the preferred embodiment of the photodetector 10 commence with growing an n type epitaxial layer 14 on an n++ substrate 12 (FIG. 6A). Next, an oxide layer is grown onto the n type epitaxial layer 14, one or more windows are formed in the oxide layer, and the epitaxial regions that are exposed by the formed windows are doped n+ (FIG. 6B). Next, the n+ doped epitaxial regions are partially diffused 16, and an oxide layer is grown over the resultant structure (FIG. 6C). Next, one or more windows which abut or slightly overlap the n+ windows previously formed are formed in the oxide layer and the newly formed windows are doped p+ (FIG. 6D). Next, the p+ regions 18, 20, and 21 (not shown in this view) and n+ regions 16 are diffused to the final junction depths (FIG. 6E). Lastly, using standard micro lithographic fabrication techniques electrical contacts in the n++ 12 and p+ 18, 20, and 21 regions are formed.

The invention has been described with reference to preferred embodiments; However, it will be appreciated that variations and modifications can be effected by a person of ordinary skill in the art without departing from the scope of the invention.

PARTS LIST:

10 detector
12 substrate
14 epitaxial layer
16 n+ region
18 p+ region
20 p+ region
21 p+ region
22 silicon dioxide layer
24 ohmic contact
25 ohmic contact
26 ohmic contact
28 silicon nitride layer
30 interconnection leads
32 electrically conductive layer
34A bonding pads
34B bonding pads
34C bonding pads
40A equivalent light activated diodes
40B equivalent light activated diodes
40C equivalent light activated diodes
42 voltage source
44A amp meters
44B amp meters
44C amp meters
50A depletion region
50B depletion region
51 non-depleted regions
52 non-depleted regions
62 metallurgical junction
72 gap
100 photodetector
120 substrate
140 epitaxial layer
180 p+ region
200 p+ region
220 silicon dioxide layer
240 ohmic contacts
260 ohmic contacts
280 silicon nitride layers
320 electrically conductive layers
500A depletion region
500A$_1$ depleted region
500A$_2$ depleted region
500B depletion region
500B$_1$ depleted region
500B$_2$ depleted region
501 non-depleted region
502 non-depleted region

I claim:
1. A semiconductor photodetector device, comprising:
an n doped support layer having first and second opposing surfaces;
at least one n+ region formed on the first surface of said n doped support layer at location(s) defining desired gap(s);
at least two p+ doped regions being formed in the n doped layer and separated by at least one of the n+ regions;
an n++ region formed on the second surface of said n doped layer; and
ohmic contacts connected to each p+ doped region and to said n++ region for receiving operating potentials that bias each p+ region, with respect to the n++ region, to act as a photodiode.

2. A photodetector, comprising:
an n++ doped substrate;
an n doped epitaxial layer grown on the n++ doped substrate;
at least one n+ region deposited on said n doped epitaxial layer at locations defining desired gaps;
at least two p+ doped regions being formed in the n doped epitaxial layer and separated by at least one of the n+ regions; and
ohmic means connected to said n++ doped substrate and to each of said at least two p+ regions for receiving operating potentials that bias each p+ region, with respect to the n++ doped substrate, to act as a photodiode.

3. A semiconductor arrangement of multiple photodiodes, comprising:
semiconductor substrate;
a plurality of regions of first conductivity type photosensitive material formed in a first surface of said substrate, said plurality of regions having gaps therebetween;
a semiconductor material of second conductivity type deposited and diffused into the gaps;
a first depletion region of a first region of first conductivity type photosensitive material of said plurality of regions of first conductivity type photosensitive material formed in said semiconductor substrate;
a second depletion region of a second region of first conductivity type photosensitive material of said plurality of regions of first conductivity type photosensitive material formed in said semiconductor substrate, wherein said semiconductor material of second conductivity type is formed in a gap between the first region of first conductivity type photosensitive material and the second region of first conductivity type photosensitive material and wherein a substantially complete overlap exists between said first depletion region and said second depletion region along a centerline of the gap between said first region of first conductivity type photosensitive material and said second region of first conductivity type photosensitive material when said first depletion region and said second depletion region are reversed biased; and
electrical conductors formed on a second surface of said semiconductor substrate opposite said first surface of said semiconductor substrate and in ohmic contact with each of the plurality of regions of first conductivity type photosensitive material for receiving operating potentials that bias each of the plurality of regions of first conductivity type, with respect to the semiconductor material of second conductivity type, to act as a photodiode.

4. A photodetector, comprising:
a semiconductor layer having a conductive layer formed thereon for forming a common electrical contact;

a plurality of p/n photodiodes and having their n semiconductor material connected to said semiconductor layer formed of n semiconductor material connected to p semiconductor material;

regions of n+ material separating the p semiconductor material of each photodiode;

a first depletion region of the p semiconductor material of a first p/n photodiode of said plurality of p/n photodiodes formed in said semiconductor layer;

a second depletion region of the p semiconductor material of a second p/n photodiode of said plurality of p/n photodiodes formed in said semiconductor layer, wherein the p semiconductor material of the first p/n photodiode and the p semiconductor material of the second p/n photodiode are separated by a region of n+ material of said regions of n+ material and wherein a substantially complete overlap exists between said first depletion region and said second depletion region along a centerline of a gap between the p semiconductor material of the first p/n photodiode and the p semiconductor material of the second p/n photodiode when said first depletion region and said second depletion region are reversed biased; and individual ohmic contacts formed on said p semiconductor material of each photodiode.

5. The semiconductor photodetector device of claim 1, further comprising:

a first depletion region of a first p+ doped region of said at least two p+ doped regions formed in said n doped support layer, wherein the first p+ doped region and the second p+ doped region are separated by an n+ region of said at least one n+ region and wherein a substantially complete overlap exists between said first depletion region and said second depletion region along a centerline of a gap between the first p+ doped region and the second p+ doped region when said first depletion region and said second depletion region are reversed biased.

6. The semiconductor photodetector device of claim 5, wherein the substantially complete overlap between said first depletion region and said second depletion region when said first depletion region and said second depletion region are reversed biased decreases the rise time and the fall time of said semiconductor photodetector device.

7. The semiconductor photodetector device of claim 6, wherein the fall time of said semiconductor photodetector device when said first depletion region and said second depletion region are reversed biased is faster than if the first p+ doped region and the second p+ doped region were not separated by the n+ region.

8. The semiconductor photodetector device of claim 6, wherein the fall time of said semiconductor photodetector device when said first depletion region and said second depletion region are reversed biased is less than 10 nS.

9. The photodetector of claim 2, further comprising:

a first depletion region of a first p+ doped region of said at least two p+ doped regions formed in said n epitaxial layer; and a second depletion region of a second p+ doped region of said at least two p+ doped regions formed in said n doped epitaxial layer, wherein the first p+ doped region and the second p+ doped region are separated by an n+ region of said at least one n+ region and wherein a substantially complete overlap exists between said first depletion region and said second depletion region along a centerline of a gap between the first p+ doped region and the second p+ doped region when said first depletion region and said second depletion region are reversed biased.

10. The photodetector of claim 9, wherein the substantially complete overlap between said first depletion region and said second depletion region when said first depletion region and said second depletion region are reversed biased decreases the rise time and the fall time of said photodetector.

11. The photodetector of claim 10, wherein the fall time of said photodetector when said first depletion region and said second depletion region are reversed biased is faster than if the first p+ doped region and the second p+ doped region were not separated by the n+ region.

12. The photodetector of claim 10, wherein the fall time of said photodetector when said first depletion region and said second depletion region are reversed biased is less than 10 nS.

13. The semiconductor arrangement of claim 3, wherein the substantially complete overlap between said first depletion region and said second depletion region when said first depletion region and said second depletion region are reversed biased decreases the rise time and the fall time of said semiconductor arrangement.

14. The semiconductor arrangement of claim 13, wherein the fall time of said semiconductor arrangement when said first depletion region and said second depletion region are reversed biased is faster than if said semiconductor material of second conductivity type were not formed in the gap between the first region of first conductivity type photosensitive material and the second region of first conductivity type photosensitive material.

15. The semiconductor arrangement of claim 13, wherein the fall time of said semiconductor arrangement when said first depletion region and said second depletion region are reversed biased is less than 10 nS.

16. The photodetector of claim 4, wherein the substantially complete overlap between said first depletion region and said second depletion region when said first depletion region and said second depletion region are reversed biased decreases the rise time and the fall time of said photodetector.

17. The photodetector of claim 16, wherein the fall time of said photodetector when said first depletion region and said second depletion region are reversed biased is faster than if the p semiconductor material of the first p/n photodiode and the p semiconductor material of the second p/n photodiode were not separated by the region of n+ material.

18. The photodetector of claim 16, wherein the fall time of said photodetector when said first depletion region and said second depletion region are reversed biased is less than 10 nS.

* * * * *